(12) United States Patent
Miyagawa et al.

(10) Patent No.: US 9,865,809 B2
(45) Date of Patent: Jan. 9, 2018

(54) NONVOLATILE RESISTANCE CHANGE ELEMENT

(71) Applicant: TOSHIBA MEMORY CORPORATION, Minato-ku (JP)

(72) Inventors: Hidenori Miyagawa, Yokohama (JP); Akira Takashima, Fuchu (JP); Shosuke Fujii, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 294 days.

(21) Appl. No.: 13/967,885

(22) Filed: Aug. 15, 2013

(65) Prior Publication Data

US 2013/0328008 A1 Dec. 12, 2013

Related U.S. Application Data

(63) Continuation of application No. PCT/JP2012/057251, filed on Mar. 14, 2012.

(30) Foreign Application Priority Data

Jul. 21, 2011 (JP) .................. 2011-160209

(51) Int. Cl.
*H01L 47/00* (2006.01)
*H01L 45/00* (2006.01)
(Continued)

(52) U.S. Cl.
CPC ...... *H01L 45/1253* (2013.01); *G11C 13/0011* (2013.01); *H01L 27/101* (2013.01);
(Continued)

(58) Field of Classification Search
CPC ... H01L 45/1233; H01L 45/146; H01L 45/08; H01L 45/145; H01L 27/2409; H01L 27/2463
See application file for complete search history.

(56) References Cited

U.S. PATENT DOCUMENTS 8,487,289 B2 * 7/2013 Yang ...................... B82Y 10/00
257/2
8,569,728 B2 * 10/2013 Takano ............... G11C 11/5685
257/2

(Continued)

FOREIGN PATENT DOCUMENTS

CN 101872836 A 10/2010
JP 2004-281913 A 10/2004
(Continued)

OTHER PUBLICATIONS

U.S. Appl. No. 13/970,169, filed Aug. 19, 2013, Miyagawa et al.
(Continued)

*Primary Examiner* — Zandra Smith
*Assistant Examiner* — John M Parker
(74) *Attorney, Agent, or Firm* — Oblon, McClelland, Maier & Neustadt, L.L.P.

(57) ABSTRACT

According to one embodiment, a nonvolatile resistance change element includes a first electrode, a second electrode and a first layer. The first electrode includes a metal element. The second electrode includes an n-type semiconductor. The first layer is formed between the first electrode and the second electrode and includes a semiconductor element. The first layer includes a conductor portion made of the metal element. The conductor portion and the second electrode are spaced apart.

17 Claims, 15 Drawing Sheets

(51) Int. Cl.
    H01L 27/10    (2006.01)
    H01L 27/24    (2006.01)
    G11C 13/00    (2006.01)
(52) U.S. Cl.
    CPC ...... *H01L 27/2472* (2013.01); *H01L 27/2481* (2013.01); *H01L 45/085* (2013.01); *H01L 45/12* (2013.01); *H01L 45/1233* (2013.01); *H01L 45/1266* (2013.01); *H01L 45/145* (2013.01); *H01L 45/148* (2013.01); *G11C 2213/33* (2013.01); *G11C 2213/34* (2013.01); *G11C 2213/77* (2013.01)

(56) References Cited

U.S. PATENT DOCUMENTS

| | | | | |
|---|---|---|---|---|
| 2005/0121697 | A1* | 6/2005 | Ishida | G11C 13/0009 257/200 |
| 2006/0289942 | A1* | 12/2006 | Horii | H01L 27/101 257/379 |
| 2007/0008865 | A1* | 1/2007 | Adams | B82Y 10/00 369/126 |
| 2007/0176264 | A1* | 8/2007 | Lee | H01L 45/145 257/614 |
| 2007/0252193 | A1 | 11/2007 | Cho et al. | |
| 2007/0295950 | A1* | 12/2007 | Cho | H01L 45/12 257/4 |
| 2008/0006907 | A1 | 1/2008 | Lee et al. | |
| 2009/0014707 | A1 | 1/2009 | Lu et al. | |
| 2009/0147558 | A1* | 6/2009 | Tamai | G11C 8/08 365/148 |
| 2010/0006813 | A1* | 1/2010 | Xi | H01L 27/2463 257/4 |
| 2010/0181546 | A1 | 7/2010 | Yamamoto et al. | |
| 2010/0327253 | A1* | 12/2010 | Nakai | H01L 45/126 257/4 |
| 2011/0031467 | A1 | 2/2011 | Kubo et al. | |
| 2011/0049463 | A1* | 3/2011 | Yamamoto | B82Y 10/00 257/4 |
| 2012/0074374 | A1* | 3/2012 | Jo | H01L 45/085 257/4 |
| 2012/0205608 | A1 | 8/2012 | Yamauchi et al. | |
| 2012/0319074 | A1 | 12/2012 | Fujii et al. | |

FOREIGN PATENT DOCUMENTS

| | | |
|---|---|---|
| JP | 2007-300100 | 11/2007 |
| JP | 2008-10836 | 1/2008 |
| JP | 2008-16854 | 1/2008 |
| JP | 2010-165950 | 7/2010 |
| JP | 2011-35284 A | 2/2011 |
| JP | 2011-49455 | 3/2011 |

OTHER PUBLICATIONS

Office Action dated Feb. 10, 2015 in Japanese Patent Application No. 2014-108583 (with English translation).
Taiwanese Office Action dated Feb. 18, 2014, in Taiwan Patent Application No. 101109501 (with English translation).
Office Action dated Mar. 25, 2014, in Japanese Patent Application No. 2011-160209 with English translation.
International Search Report dated Jun. 12, 2012, in PCT/JP2012/057251 filed Mar. 14, 2012 (in English language).
International Written Opinion dated Jun. 12, 2012, in PCT/JP2012/057251 filed Mar. 14, 2012 (in English language).
Sung Hyun Jo et al., "CMOS Compatible Nanoscale Nonvolatile Resistance Switching Memory", NANO Letters 2008, vol. 8, No. 2, Jan. 2008, pp. 392-397.
Kuk-Hwan Kim, et al., "Nanoscale resistive memory with intrinsic diode characteristics and long endurance", Applied Physics Letters, vol. 96, No. 053106, Feb. 2010, 3 pages.
Combined Office Action and Search Report dated Jul. 3, 2015 in Chinese Patent Application No. 201280010756.3 with English translation and English translational of category of cited documents.
International Preliminary Report on Patentability with Written Opinion dated Jan. 30, 2014 in the International Application No. PCT/JP2012/057251 filed on Mar. 14, 2012 (English Translation only).
Office Action dated Mar. 4, 2016 in European Patent Application No. 12 815 480.4.
Combined Taiwanese Office Action and Search Report dated Feb. 22, 2016 in Patent Application No. 103128957 (with English language translation).
Office Action dated Oct. 21, 2015 in European Patent Application No. 12 815 480.4.

* cited by examiner

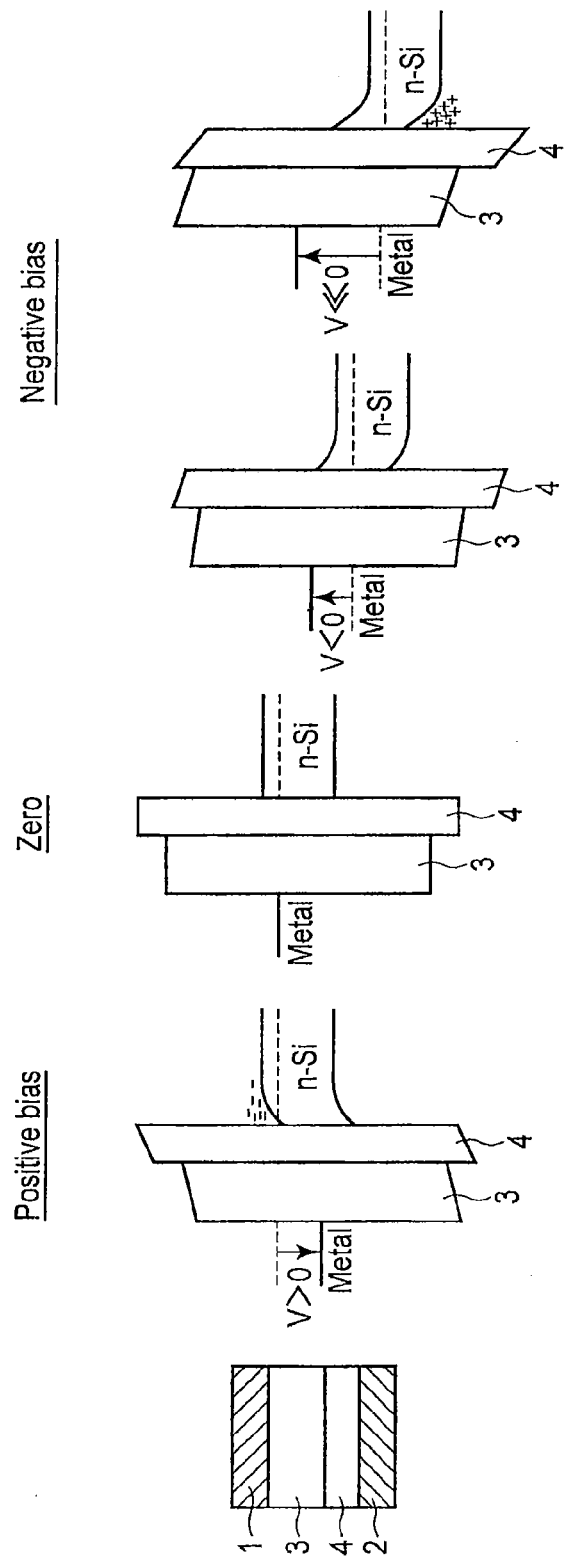

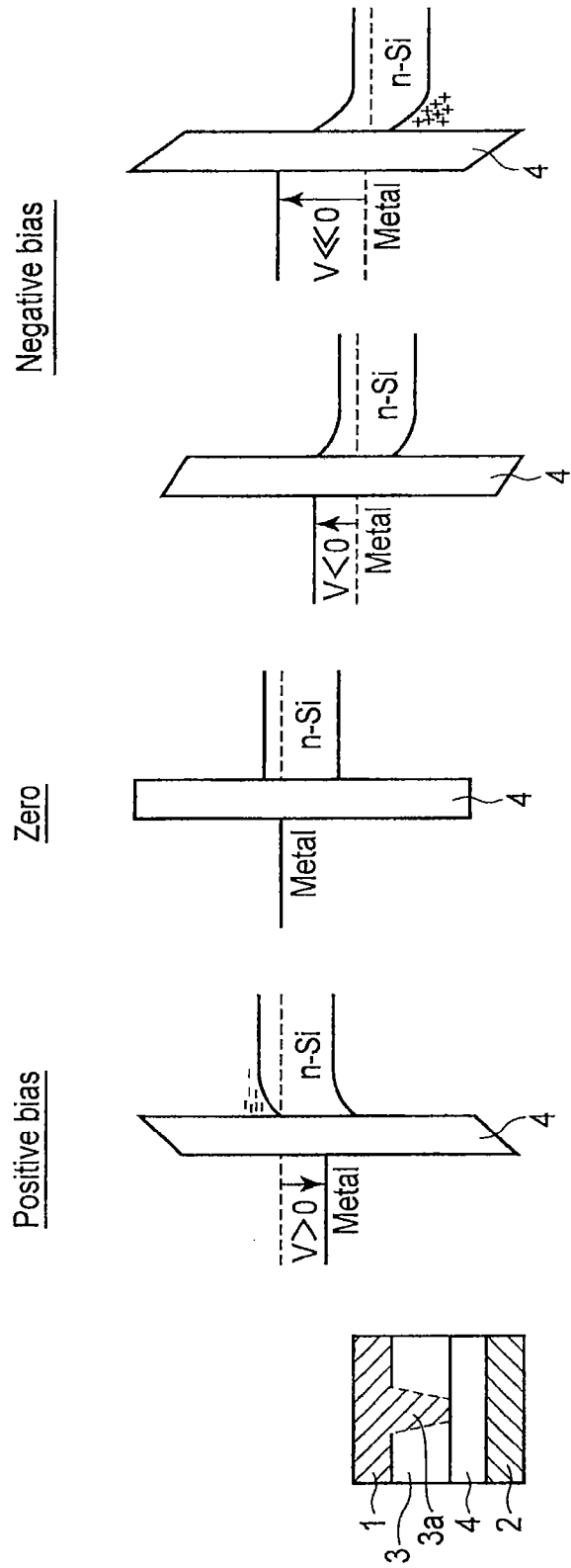

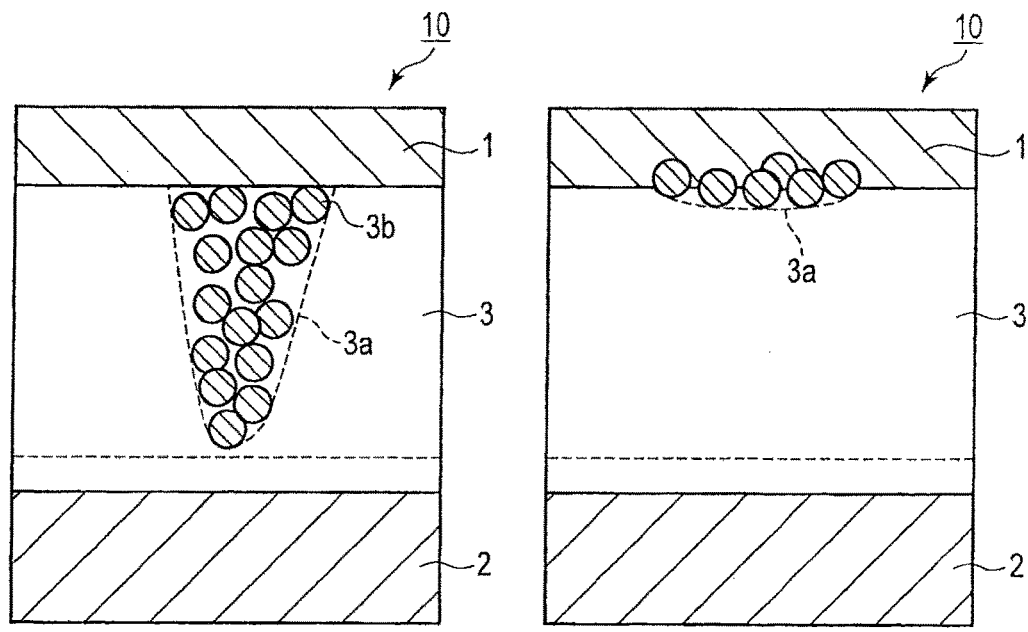
F I G. 6A   F I G. 6B
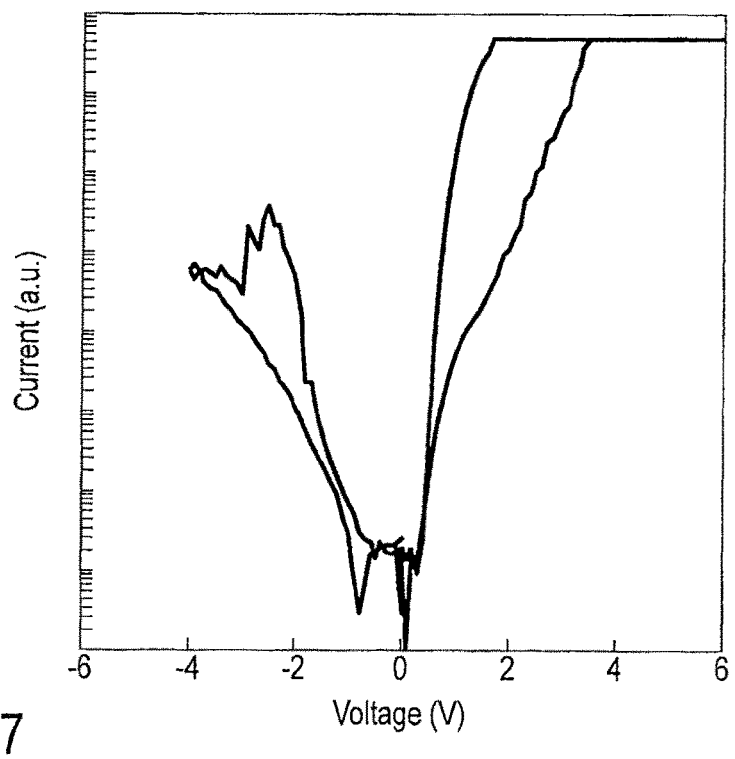
F I G. 7

NONVOLATILE RESISTANCE CHANGE ELEMENT

CROSS REFERENCE TO RELATED APPLICATIONS

This application is a Continuation Application of PCT Application No. PCT/JP2012/057251, filed Mar. 14, 2012 and based upon and claiming the benefit of priority from Japanese Patent Application No. 2011-160209, filed Jul. 21, 2011, the entire contents of all of which are incorporated herein by reference.

FIELD

Embodiments described herein relate generally to a nonvolatile resistance change element.

BACKGROUND

Recently, the development of two-terminal nonvolatile resistance change elements such as a ReRAM (Resistive Random Access Memory) is being extensively performed. This nonvolatile resistance change element can perform a low-voltage operation and high-speed switching and can be downsized, and hence is a leading candidate for a next-generation, large-capacity memory device that replaces a floating gate type NAND flash memory. In particular, a nonvolatile resistance charge element using amorphous silicon as a resistance change layer is promising from the viewpoints of a low-current operation, the data retention, the endurance, and downsizing.

A memory having a cross-point structure has been proposed as a large-capacity memory device using this nonvolatile resistance change element as a memory cell. In this cross-point memory, a sneak current that sneaks to an unselected cell is generated when performing write, read, or erase to a selected cell.

If this sneak current is generated, the power consumption increases in a large-capacity memory device, and write and erase to a selected cell become difficult. In addition, an array itself can no longer function because the increase in electric current causes disconnection of an interconnection or the like. In the cross-point structure, therefore, the two-terminal nonvolatile resistance change element must be given a rectifying function by combining a diode.

Unfortunately, combining the nonvolatile resistance change element and a diode increases the element size, and this makes integration difficult. To solve these problems, a nonvolatile resistance change element with a rectifying function is necessary, and demands have presently arisen for the development of the element.

The nonvolatile resistance change element includes a resistance change layer, a metal electrode, and a semiconductor layer as a counterelectrode for the metal electrode. A conductive filament growing from the metal electrode is shortcircuited to the counterelectrode and restored in the metal electrode, thereby changing the resistance between the electrodes and achieving switching characteristics. In this resistance change element, the conductive filament comes in direct contact with the semiconductor layer. Therefore, a chemical reaction in the interface may change the Schottky characteristics, or the diffusion of the conductive filament (a metal) to the semiconductor layer may form recombination centers and vary an electric current, i.e., the device characteristics may vary.

BRIEF DESCRIPTION OF THE DRAWINGS

FIGS. 1A, 1B, 1C, 1D, and 1E are views showing the structure and band diagrams of a nonvolatile resistance change element according to an embodiment;

FIGS. 2A, 2B, 2C, 2D, and 2E are views showing the structure and band diagrams of the nonvolatile resistance change element according to the embodiment;

FIGS. 6A and 6B are sectional views respectively showing the low-resistance state and high-resistance state of the nonvolatile resistance change element according to the first embodiment;

FIG. 7 is a graph showing the current-voltage characteristics of the nonvolatile resistance change element according to the first embodiment;

DETAILED DESCRIPTION

Figures 3A, 3B, 3C, 3D, 3E:
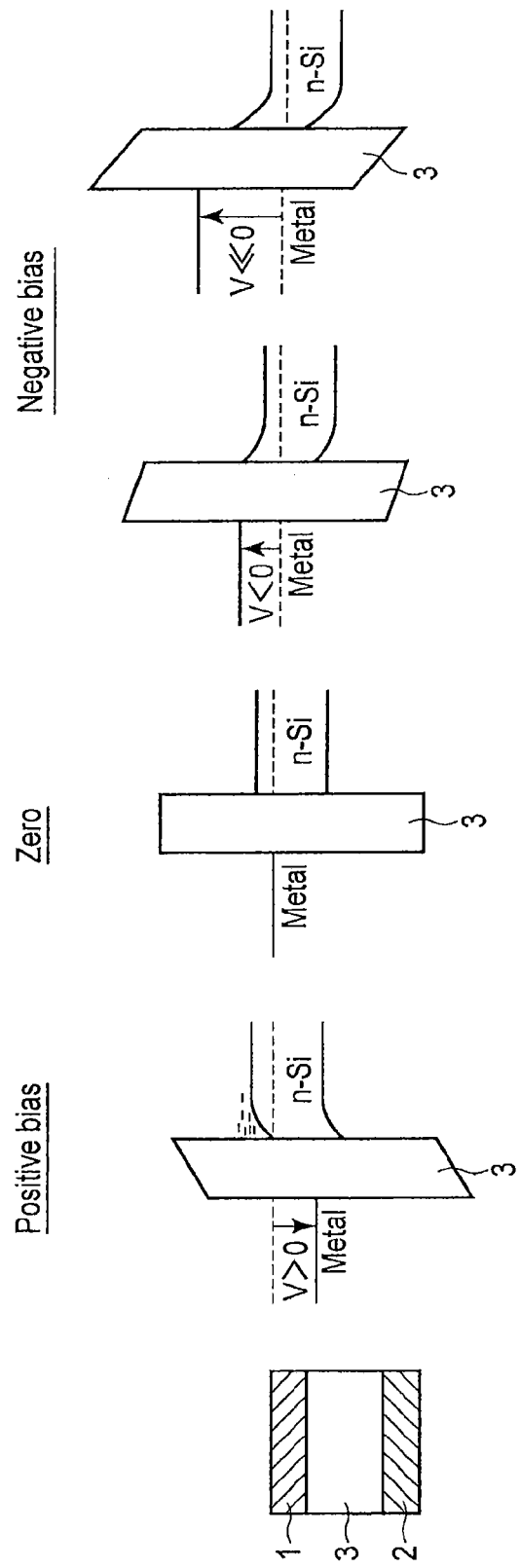
FIGS. 3A, 3B, 3C, 3D, and 3E are views showing the structure and band diagrams of a nonvolatile resistance change element according to a comparative example.

Nonvolatile resistance change elements of embodiments will be explained below with reference to the accompanying drawing. Note that in the following explanation, the same reference numerals denote constituent elements having the same functions and arrangements, and a repetitive explanation will be made only when necessary.

In general, according to one embodiment, a nonvolatile resistance change element includes a first electrode, a second electrode and a first layer. The first electrode includes a metal element. The second electrode includes an n-type semiconductor. The first layer is formed between the first electrode and the second electrode and includes a semiconductor element. The first layer includes a conductor portion made of the metal element. The conductor portion and the second electrode are spaced apart.

[Basic Concept]

A nonvolatile resistance change element of an embodiment includes a first electrode, a second electrode opposing the first electrode, and a resistance change layer formed between the first and second electrodes. The first electrode contains a metal element, and the second electrode contains an n-type semiconductor. The resistance change layer is made of a semiconductor layer.

The resistance change layer has a conductor portion (to be referred to as a filament hereinafter) made of the metal element contained in the first electrode. The filament of the resistance change layer is spaced apart from the second electrode.

An anti-diffusion layer may also be formed between the resistance change layer and second electrode. The anti-diffusion layer prevents the diffusion of the filament from the resistance change layer to the second electrode. This forms the space between the filament and second electrode.

The resistance of the resistance change layer is reversibly changeable because the filament extends from and retracts to the first electrode. The space between the filament of the resistance change layer and the second electrode is formed by electrical control of the first and second electrodes, or the insertion of the anti-diffusion layer between the resistance change layer and second electrode.

The structure and band diagrams of the nonvolatile resistance change element (including the anti-diffusion layer) of the embodiment will be described below.

FIGS. 1A and 2A illustrate the structure of the nonvolatile resistance change element of the embodiment. FIG. 1A shows a high-resistance state, and FIG. 2A shows a low-resistance state.

As shown in FIGS. 1A and 2A, a resistance change layer 3 is formed between a first electrode 1 and second electrode 2, and an anti-diffusion layer 4 is formed between the resistance change layer 3 and second electrode 2. In the high-resistance state shown in FIG. 1A, no filament is formed in the resistance change layer 3, so the nonvolatile resistance change element is set in the high-resistance state. In the low-resistance state shown in FIG. 2A, a filament 3a extending from the first electrode 1 to the anti-diffusion layer 4 is formed in the resistance change layer 3, so the nonvolatile resistance change element is set in the low-resistance state. The first electrode 1 is made of a metal, and the second electrode 2 is made of n-type silicon (Si).

FIGS. 1B, 1C, 1D, and 1E are band diagrams in the high-resistance state shown in FIG. 1A. FIGS. 2B, 2C, 2D, and 2E are band diagrams in the low-resistance state shown in FIG. 2A.

When a positive voltage is applied to the first electrode 1 as an ion supply source in the high-resistance state shown in FIG. 1A in which no filament is formed, the n-type Si of the second electrode 2 is set in a storage state (FIG. 1B). By contrast, when a negative voltage is applied to the first electrode 1, a depletion layer is formed in the second electrode 2 (FIG. 1D). When a high negative voltage is further applied, inversion occurs (FIG. 1E).

Even in the low-resistance state shown in FIG. 2A in which the filament 3a is formed, when a negative voltage is applied to the first electrode 1, the metal forming the filament 3a and the n-type Si of the second electrode 2 do not directly couple with each other because the anti-diffusion layer 4 is formed, so a depletion layer is formed as in the high-resistance state (FIG. 2D). No electric current flows when the depletion layer is formed. Accordingly, a rectifying effect that makes a current-voltage curve asymmetrical is obtained by a structure in which a depletion layer is formed even in the low-resistance state. Inversion occurs when a high negative voltage is further applied to the first electrode 1. Since a sufficient voltage is applied to the resistance change layer 3 as well, a reset operation of switching the low-resistance state to the high-resistance state occurs (FIG. 2E).

On the other hand, band diagrams are as follows when no anti-diffusion layer is formed between the resistance change layer 3 and second electrode 2, and no space is formed between the filament 3a and second electrode 2.

When a positive voltage is applied to the first electrode 1 as an ion supply source in the high-resistance state shown in FIG. 3A in which no filament is formed, the n-type Si of the second electrode 2 is set in the storage state (FIG. 3B). By contrast, a depletion layer is formed in the second electrode 2 when a negative voltage is applied to the first electrode 1 (FIG. 3D), and inversion occurs when a high negative voltage is applied (FIG. 3E).

Figures 4A, 4B, 4C, 4D:
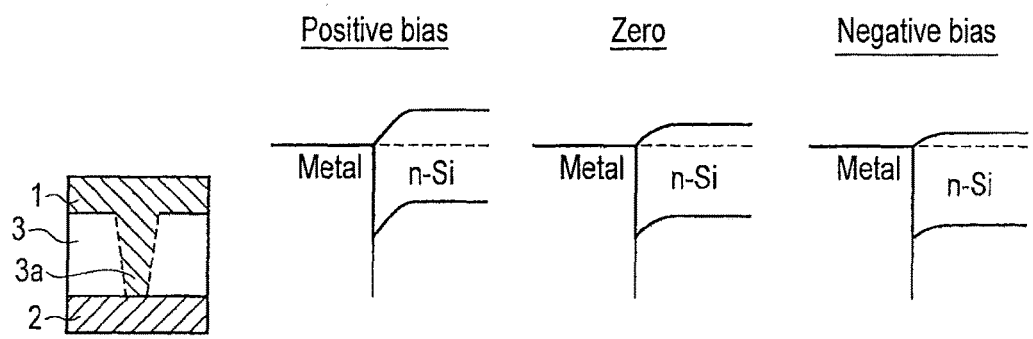
FIGS. 4A, 4B, 4C, and 4D are views showing the structure and band diagrams of the nonvolatile resistance change element according to the comparative example.

When a negative voltage is applied to the first electrode 1 in the low-resistance state shown in FIG. 4A in which the filament is formed, however, the metal forming the first electrode 1 (filament 3a) and the n-type Si of the second electrode 2 directly couple with each other. Especially when the work function of the metal of the first electrode 1 is smaller than that of the n-type Si, ohmic contact is obtained. Accordingly, no depletion layer is formed even when a negative voltage is applied to the first electrode 1, and no rectifying effect is obtained (FIG. 4D).

Since the use of the n-type semiconductor as the second electrode and the formation of the space between the filament of the resistance change layer and the second electrode are combined, it is possible to form a nonvolatile resistance change element capable of reducing the deterioration and variations of the device characteristics and having a rectifying function, compared to the conventional structures.

First Embodiment

[1] Structure of Nonvolatile Resistance Change Element

Figure 5:
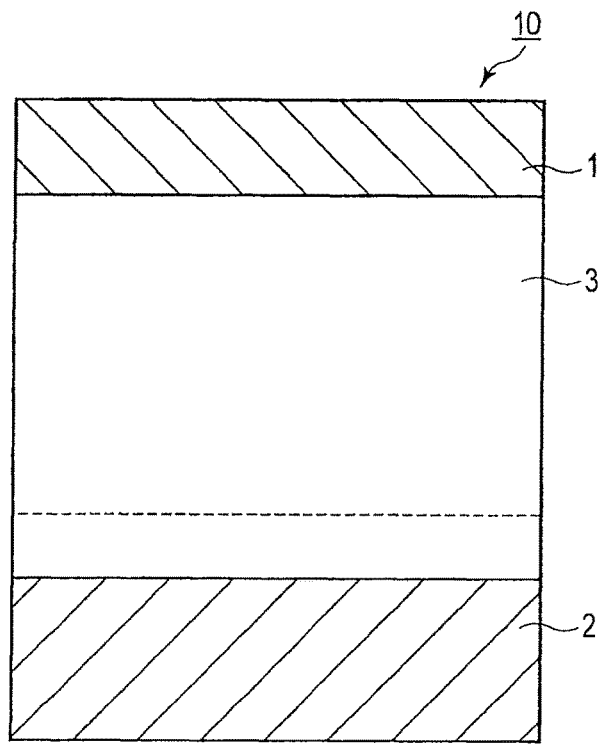
FIG. 5 is a sectional view showing the structure of a nonvolatile resistance change element according to a first embodiment.

FIG. 5 is a sectional view showing the structure of a nonvolatile resistance change element according to the first embodiment.

As shown in FIG. 5, a nonvolatile resistance change element 10 includes an upper electrode (first electrode) 1, lower electrode (second electrode) 2, and resistance change layer (first layer) 3. The resistance change layer 3 is formed between the upper electrode 1 and lower electrode 2. A filament made of a metal element contained in the upper electrode 1 is formed in the resistance change layer 3. The filament formed in the resistance change layer 3 is spaced apart from the lower electrode 2. In other words, the filament of the resistance change layer 3 is isolated from the lower electrode 2.

The upper electrode 1 is an electrode containing a metal. Examples of a material applicable as the upper electrode 1 are Ag, Co, Ni, Ti, Cu, Al, Au, Fe, Cr, W, Hf, Ta, Pt, Ru, Zr, Ir, and their nitrides, carbides, oxides, and silicides. It is also possible to use an alloy material containing any of these metals as the upper electrode 1.

The lower electrode 2 is made of, e.g., an n-type semiconductor layer. The n-type impurity concentration in the n-type semiconductor layer is desirably $10^{18}$ cm$^{-3}$ or less at which the depletion of an n-type semiconductor becomes significant. Also, the resistance value of the lower electrode 2 is desirably 0.01Ω or more. Furthermore, silicon in which an impurity is heavily doped may also be used as the lower electrode 2.

The resistance change layer 3 is made of, e.g., a semiconductor layer. Semiconductor elements contained in the semiconductor layer can be selected from, e.g., Si, Ge, SiGe, GaAs, InP, GaP, GaInAsP, GaN, and SiC. The resistance change layer 3 may also be an amorphous semiconductor, polycrystalline semiconductor, or single-crystal semiconductor. For example, amorphous silicon, polycrystalline silicon, or single-crystal silicon can be used as the resistance change layer 3. Furthermore, nitrogen (N) or oxygen (O) may be added to the semiconductor elements contained in the resistance change layer 3. Examples are silicon nitride (SiN$_x$) and silicon oxide (SiO$_x$).

The film thickness of the resistance change layer 3 is typically 1 to 300 nm. The film thickness is preferably small in order to downsize the resistance change element 10. However, a film thickness of 2 to 50 nm is more favorable because no uniform film is obtained if the film thickness is too small. An optimal film thickness of the resistance change layer 3 is determined by the material and resistance value of the resistance change layer.

The lower electrode 2 is an electrode functioning as an underlayer when forming the variable resistance layer 3. The upper electrode 1 is an electrode to be formed after the variable resistance layer 3 is formed.

[2] Method of Manufacturing Nonvolatile Resistance Change Element

Next, a method of manufacturing the nonvolatile resistance change element disclosed in the first embodiment will be explained.

First, phosphorus (P) ions are implanted into a semiconductor substrate, e.g., a silicon single-crystal substrate at an acceleration voltage of 30 keV and a dose of 4×10$^{13}$ cm$^{-2}$. After that, activation annealing is performed on the silicon substrate, thereby forming an n-type silicon layer as the lower electrode 2.

Then, amorphous silicon as the resistance change layer 3 is deposited on the lower electrode 2 by CVD (Chemical Vapor Deposition). In this embodiment, the amorphous silicon film is formed at a deposition temperature of 250° C. by using PE-CVD (Plasma-Enhanced Chemical Vapor Deposition).

Subsequently, Ag as the upper electrode 1 is formed on the resistance change layer 3 by sputtering or the like. The nonvolatile resistance change element 10 shown in FIG. 5 is manufactured as described above.

[3] Characteristics of Nonvolatile Resistance Change Element

The switching principle of the resistance change element 10 manufactured by the above-described manufacturing method will be explained with reference to FIGS. 6A and 6B.

FIG. 6A is a sectional view showing the low-resistance state of the nonvolatile resistance change element 10 shown in FIG. 5.

The filament 3a formed in the resistance change layer 3 grows as follows. A set voltage is applied to the upper electrode 1 by setting the potential of the upper electrode 1 to be higher than that of the lower electrode 2. When the set voltage is applied to the upper electrode 1, the metal element in the upper electrode 1 is ionized, and an ionized metal element (metal ions) 3b enters the resistance change layer 3 as shown in FIG. 6A. At the same time, electrons are supplied to the resistance change layer 3 via the lower electrode 2.

Since the metal ions 3b couple with the electrons in the resistance change layer 3, a filament 3a made of the metal element of the upper electrode 1 grows into the resistance change layer 3. The filament 3a grows in the resistance change layer 3 toward the lower electrode 2 but does not reach the lower electrode 2, and hence has a structure in which the filament 3a is spaced apart from the lower electrode 2. Since this decreases the resistance between the upper electrode 1 and lower electrode 2, the nonvolatile resistance change element 10 is set in the low-resistance state.

FIG. 6B is a sectional view showing the high-resistance state of the nonvolatile resistance change element 10 shown in FIG. 5.

The filament 3a formed in the resistance change layer 3 disappears as follows. A reset voltage is applied to the upper electrode 1 by setting the potential of the upper electrode 1 to be lower than that of the lower electrode 2. When the reset voltage is applied to the upper electrode 1, holes are supplied to the resistance change layer 3 via the lower electrode 2, and the metal element forming the filament 3a in the resistance change layer 3 is ionized. Since the metal element of the filament 3a is collected to the upper electrode 1, the filament 3a in the resistance change layer 3 disappears. Consequently, the nonvolatile resistance change element 10 is reset to the high-resistance state.

The low-resistance state and high-resistance state described above are reversibly controllable by the polarity of voltage application. In this control, the high-resistance state and low-resistance state are respectively made to correspond to an OFF state and ON state. When a given voltage is applied, whether the nonvolatile resistance change element 10 is in the ON state or OFF state is determined by reading the value of an electric current flowing through it. This allows the nonvolatile resistance change element 10 to operate as a memory. Also, a nonvolatile memory can be implemented because the transition between the high-resistance state and low-resistance state occurs only when a voltage is applied.

Note that as shown in FIGS. 6A and 6B, the example in which the low-resistance state and high-resistance state are formed by the growth and disappearance of the filament 3a in the resistance change layer 3 is explained. However, the low-resistance state and high-resistance state may also be formed by diffusing the metal element of the upper electrode 1 in the whole resistance change layer 3.

FIG. 7 is a graph showing the current-voltage characteristics of the nonvolatile resistance change element 10 shown in FIG. 5, and represents the switching characteristics of the nonvolatile resistance change element 10.

In this embodiment, in order to form the space between the filament 3a and lower electrode 2, electrical control is performed by setting upper-limit current limiting (a compliance current) by DC measurement. In this embodiment, the compliance current is 500 nA. The control of the filament 3a is not restricted to the upper-limit current limiting, and may also be pulse control. Examples of the pulse control method are control methods of optimizing the pulse width, the pulse time, and the number of times of pulse application.

As shown in FIG. 7, the high-resistance state changes to the low-resistance state when the voltage to be applied to the upper electrode 1 of the nonvolatile resistance change element is increased in the positive direction. On the other hand, when the voltage to be applied to the upper electrode 1 of the nonvolatile resistance change element in the low-resistance state is swept in the negative direction, a region where no large electric current flows exists up to about 1 V. When the voltage is further swept in the negative direction, the electric current abruptly reduces, and the low-resistance state changes to the high-resistance state.

In the high-resistance state, within a range in which the voltage to be applied to the upper electrode 1 is higher than a reset voltage Vreset to some extent, almost no electric current flows with respect to the voltage. When the voltage to be applied to the upper electrode 1 is further swept in the positive direction from this state, the high-resistance state changes to the low-resistance state.

That is, this nonvolatile resistance change element reversibly changes between the high-resistance state and low-resistance state, and can store one-bit data.

Also, the current-voltage characteristics shown in FIG. 7 reveal that when the voltage is swept from 0 V to the reset voltage between the upper electrode 1 and lower electrode 2, the maximum value of a current change amount between 0 V and a ½ voltage of the reset voltage is smaller than that of a current change amount between the ½ voltage of the reset voltage and the reset voltage.

Figure 8:
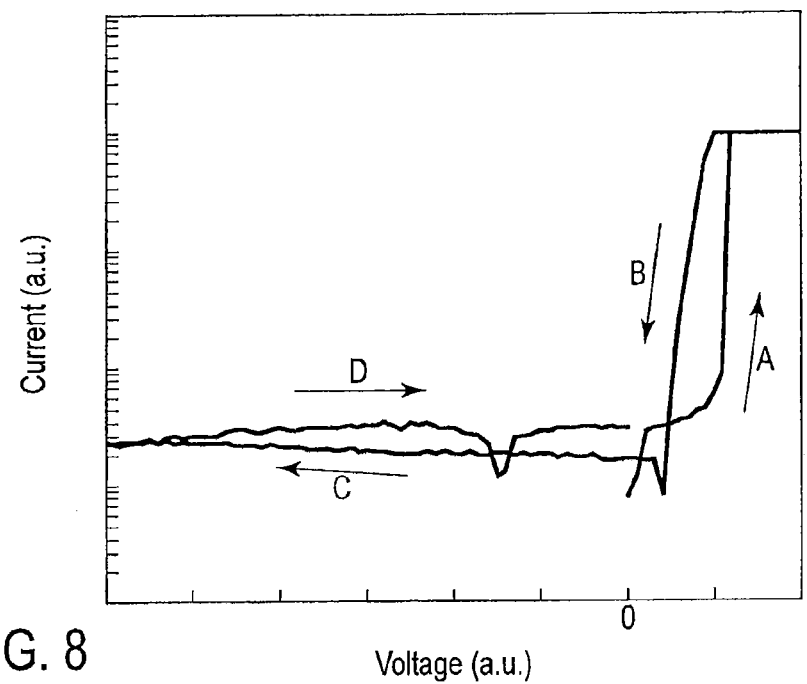
FIG. 8 is a graph showing the current-voltage characteristics of another nonvolatile resistance change element according to the first embodiment.

FIG. 8 is a graph showing the current-voltage characteristics of another nonvolatile resistance change element.

As shown in FIG. 8, when a voltage to be applied to an upper electrode as an ion supply source is swept from 0 V to a positive voltage, a filament is formed in a resistance change layer, and the nonvolatile resistance change element changes from the high-resistance state to the low-resistance state (an arrow A). Since the resistance change element is in the low-resistance state, the element is destroyed if a large electric current flows. To prevent this, therefore, an electric current larger than the set electric current is prevented by using a current limiting function of a measurement device.

Then, sweeping is performed from the positive voltage to 0 V (an arrow B). In addition, after a negative voltage is applied from 0 V (an arrow C), sweeping is performed from the negative voltage to 0 V (an arrow D). When the negative voltage is applied, a depletion layer is formed in a lower electrode, and this suppresses the electric current flowing between the upper and lower electrodes. On this current-voltage curve, a reset operation of changing the low-resistance state to the high-resistance state occurs when the depletion layer is formed. Even the nonvolatile resistance change element having this current-voltage characteristic can store one-bit data because the resistance state of the element reversibly changes between the high-resistance state and low-resistance state.

Also, the current-voltage characteristics shown in FIG. 8 reveal that when the voltage is swept from 0 V to the reset voltage between the upper electrode 1 and lower electrode 2, the maximum value of a current change amount between a voltage that is 1/10 the reset voltage and the reset voltage is one order of magnitude or smaller.

In the nonvolatile resistance change element of this embodiment, the space is formed between the filament 3a and lower electrode 2, and an n-type semiconductor is used as the lower electrode 2. Since this combination is used, the n-type semiconductor is set in the storage state when a positive voltage is applied to the upper electrode 1. By contrast, a depletion layer is formed in the n-type semiconductor when a negative voltage is applied to the upper electrode 1, and inversion occurs upon application of a high voltage. The state of the n-type semiconductor as the lower electrode 2 changes in accordance with the polarity of the voltage and the difference between the magnitudes of the voltages. By incorporating this n-type semiconductor as an electrode into the nonvolatile resistance change element itself, the current-voltage characteristic of the element itself becomes asymmetrical in accordance with the polarity, so a nonvolatile resistance change element having a rectifying function is implemented.

Also, in the ON state, the filament 3a neither comes in direct contact with nor enters the lower electrode 2. If the metal diffuses in the lower electrode 2, the metal forms recombination centers, and an electric current increases when a negative voltage is applied to the upper electrode 1, thereby deteriorating the device characteristics. This embodiment can prevent this.

Second Embodiment

A nonvolatile resistance change element of the second embodiment includes an anti-diffusion layer 4 between a resistance change layer 3 and lower electrode 2. The rest of the arrangement is the same as that of the first embodiment.

[1] Structure of Nonvolatile Resistance Change Element

Figure 9:
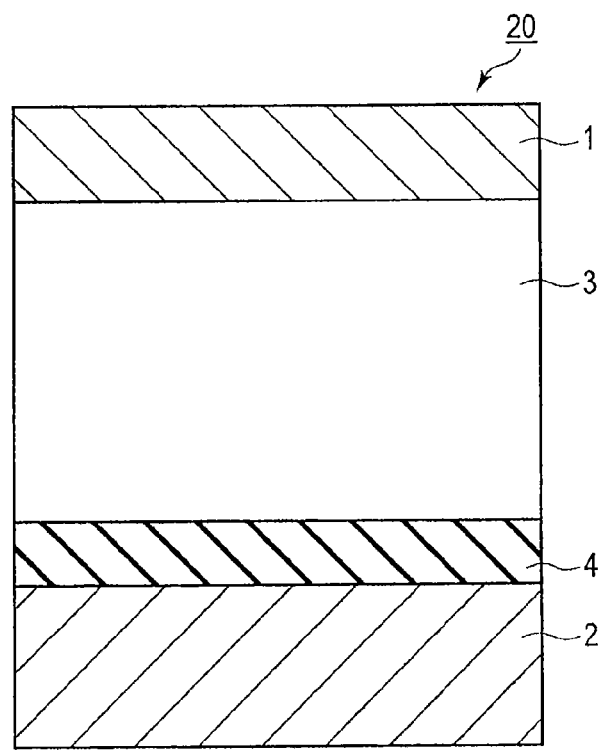
FIG. 9 is a sectional view showing the structure of a nonvolatile resistance change element according to a second embodiment.

FIG. 9 is a sectional view showing the structure of the nonvolatile resistance change element according to the second embodiment.

As shown in FIG. 9, a nonvolatile resistance change element 20 includes an upper electrode (first electrode) 1, the lower electrode (second electrode) 2, the resistance change layer (first layer) 3, and the anti-diffusion layer (second layer) 4. The resistance change layer 3 is formed between the upper electrode 1 and lower electrode 2. The anti-diffusion layer 4 is formed between the resistance change layer 3 and lower electrode 2. A filament made of a metal element contained in the upper electrode 1 is formed in the resistance change layer 3. The anti-diffusion layer 4 prevents the diffusion of the filament to the lower electrode 2. In other words, the anti-diffusion layer 4 is formed between the resistance change layer 3 and lower electrode 2 in order to form a space between the filament of the resistance change layer 3 and the lower electrode 2.

The anti-diffusion layer 4 is desirably made of a material by which the diffusion coefficient of the metal forming the filament is smaller than that of the resistance change layer 3. Also, a material having mobility smaller than that of the resistance change layer 3 in a state in which the metal is ionized is preferable. For example, a material having a high dielectric constant (high-k) is used as the anti-diffusion layer 4. Furthermore, a silicon oxide film ($SiO_x$), silicon oxynitride film ($SiO_xN_y$), silicon nitride film ($SiN_x$), or the like is used as the anti-diffusion layer 4. For example, a silicon oxide film or silicon nitride film is preferably used as an anti-diffusion layer against Ag, Ni, or Co.

The resistance change layer 3 is made of, e.g., a semiconductor layer. Examples of the material of the resistance change layer 3 are Si, Ge, SiGe, GaAs, InP, GaP, GaInAsP, GaN, SiC, and their oxides, nitrides, oxynitrides, and carbides. These materials may also be amorphous, polycrystalline, or single-crystal. For example, amorphous silicon, polycrystalline silicon, or single-crystal silicon can be used. Since a material having the same composition is used in the anti-diffusion layer 4 and resistance change layer 3, the materials of the anti-diffusion layer 4 and resistance change layer 3 are determined by a combination of the two layers.

[2] Method of Manufacturing Nonvolatile Resistance Change Element

Next, a method of manufacturing the nonvolatile resistance change element disclosed in the second embodiment will be explained.

First, phosphorus (P) ions are implanted into a semiconductor substrate, e.g., a silicon single-crystal substrate at an acceleration voltage of 30 keV and a dose of $4\times10^{13}$ cm$^{-2}$. After that, activation annealing is performed on the silicon substrate, thereby forming an n-type silicon layer as the lower electrode 2.

Then, the anti-diffusion layer 4, e.g., a silicon nitride film is deposited on the lower electrode 2 by CVD. In addition, amorphous silicon as the resistance change layer 3 is deposited on the anti-diffusion layer 4 by CVD. In this embodiment, the amorphous silicon film is formed at a deposition temperature of 250° C. by using PE-CVD (Plasma-Enhanced Chemical Vapor Deposition).

Subsequently, Ag as the upper electrode 1 is formed on the resistance change layer 3 by sputtering or the like. The nonvolatile resistance change element 20 shown in FIG. 9 is manufactured as described above.

[3] Characteristics of Nonvolatile Resistance Change Element

Figures 10A, 10B:
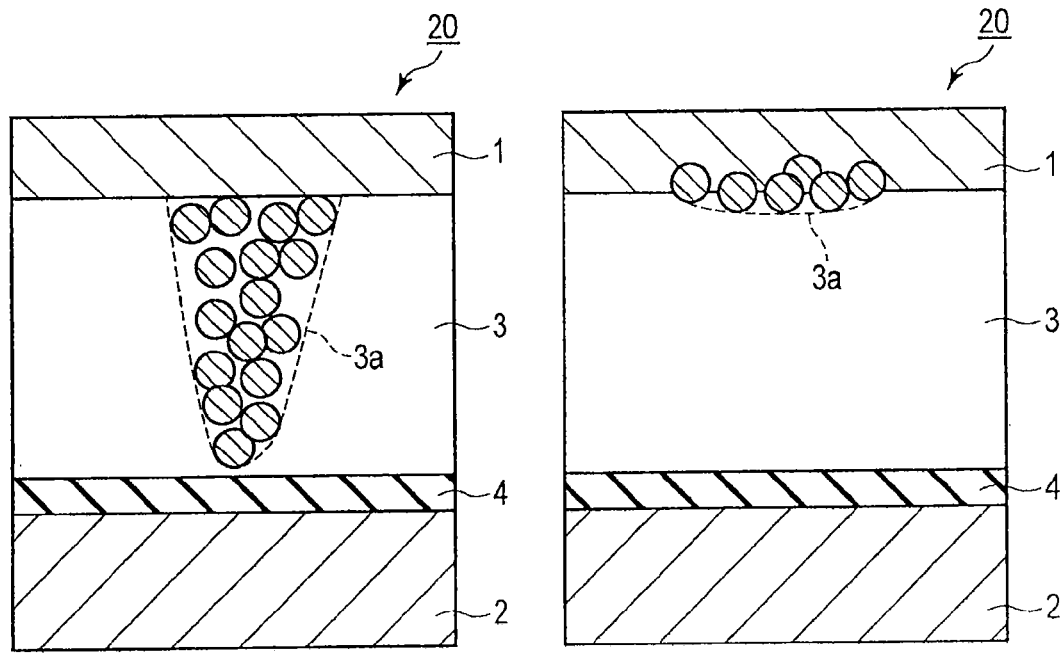
FIGS. 10A and 10B are sectional views respectively showing the low-resistance state and high-resistance state of the nonvolatile resistance change element according to the second embodiment.

FIG. 10A is a sectional view showing the low-resistance state of the nonvolatile resistance change element 20 shown in FIG. 9.

The anti-diffusion layer 4 made of a material in which the filament 3a moves and diffuses harder than in the resistance change layer 3 is formed between the lower electrode 2 and resistance change layer 3. When a set voltage is applied to the upper electrode 1, therefore, the growth of the filament 3a stops in the interface between the anti-diffusion layer 4 and resistance change layer 3 or inside the anti-diffusion layer 4. This makes it possible to form a space between the filament 3a and lower electrode 2 even when an n-type semiconductor is used as the lower electrode 2 and the filament 3a is formed in the resistance change layer 3.

When using an insulating material as the anti-diffusion layer 4, the filament 3a, anti-diffusion layer 4, and lower electrode (n-type semiconductor) 2 form a MIS (Metal-Insulator-Silicon) structure. When a positive voltage is applied to the upper electrode 1 on this MIS structure, the n-type semiconductor as the lower electrode 2 is set in a storage state. On the other hand, when a negative voltage is applied to the upper electrode 1, the n-type semiconductor of the lower electrode 2 is depleted. When a high negative voltage is further applied, inversion occurs. Since almost no electric current flows in the depleted state, a difference is produced between the values of electric currents flowing between the upper electrode 1 and lower electrode 2, when a potential is applied to the upper electrode 1 and when a potential is applied to the lower electrode 2. As a consequence, a rectifying function is given to the resistance change element 20 without adding any diode.

Figure 10C:
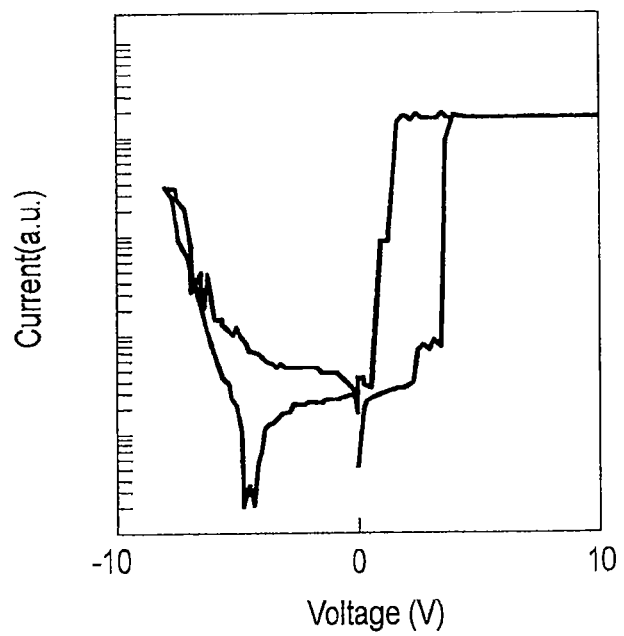
FIG. 10C is a graph showing the current-voltage characteristics of the nonvolatile resistance change element according to the second embodiment.

FIG. 10C is a graph showing the current-voltage characteristics of the nonvolatile resistance change element 20 shown in FIG. 9, and represents the switching characteristics of the nonvolatile resistance change element 20.

In the nonvolatile resistance change element 20, an n-type silicon electrode having an n-type impurity concentration of $10^{18}$ cm$^{-3}$ was used as the lower electrode 2, a silicon nitride film was used as the anti-diffusion layer 4, amorphous silicon was used as the resistance change layer 3, and Ag was used as the upper electrode 1.

As shown in FIG. 10C, when the voltage to be applied to the upper electrode 1 of the nonvolatile resistance change element 20 is increased in the positive direction, the high-resistance state changes to the low-resistance state. On the other hand, when the voltage to be applied to the upper electrode 1 of the nonvolatile resistance change element 20 in the low-resistance state is swept in the negative direction, there is a region where no large electric current flows. When the voltage is further swept in the negative direction, the electric current abruptly reduces, and the low-resistance state changes to the high-resistance state.

Also, the current-voltage characteristics shown in FIG. 10C reveal that when the voltage is swept from 0 V to the reset voltage between the upper electrode 1 and lower electrode 2, the maximum value of a current change amount between 0 V and a ½ voltage of the reset voltage is smaller than that of a current change amount between the ½ voltage of the reset voltage and the reset voltage.

In the nonvolatile resistance change element of this embodiment as described above, the anti-diffusion layer (insulator) 4 forms a space between the filament 3a and lower electrode 2, and an n-type semiconductor is used as the lower electrode 2. Since this combination is used, the n-type semiconductor is set in the storage state when a positive voltage is applied to the upper electrode 1. By contrast, a depletion layer is formed in the n-type semiconductor when a negative voltage is applied to the upper electrode 1, and inversion occurs upon application of a high voltage. The state of the n-type semiconductor as the lower electrode 2 changes in accordance with the polarity of the voltage and the difference between the magnitudes of the voltages. By incorporating this n-type semiconductor as an electrode into the nonvolatile resistance change element itself, the current-voltage characteristic of the element itself becomes asymmetrical in accordance with the polarity, so a nonvolatile resistance change element having a rectifying function is implemented.

Third Embodiment

A nonvolatile resistance change element of the third embodiment includes two kinds of amorphous silicon films formed under different deposition conditions as a resistance change layer 3. The rest of the arrangement is the same as that of the first embodiment.

[1] Structure of Nonvolatile Resistance Change Element

Figure 11:
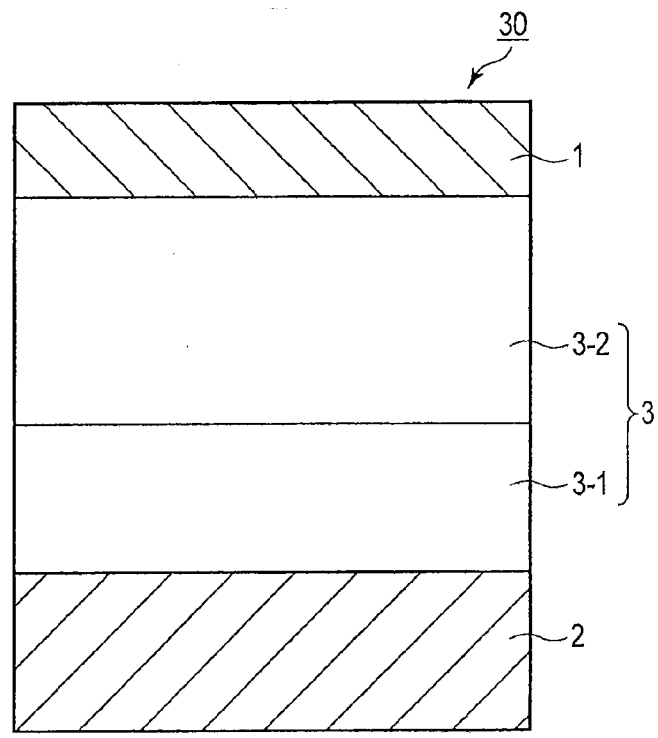
FIG. 11 is a sectional view showing the structure of a nonvolatile resistance change element according to a third embodiment.

FIG. 11 is a sectional view showing the structure of the nonvolatile resistance change element according to the third embodiment.

As shown in FIG. 11, a nonvolatile resistance change element 30 includes an upper electrode (first electrode) 1, a lower electrode (second electrode) 2, and the resistance change layer (semiconductor layer) 3. The resistance change layer 3 includes a first resistance change layer 3-1 and second resistance change layer 3-2. Between the lower electrode 2 and upper electrode 1, the first and second resistance change layers 3-1 and 3-2 are stacked on the lower electrode 2 in the order of the first resistance change layer 3-1 and second resistance change layer 3-2. A filament made of a metal element contained in the upper electrode 1 is formed in the second resistance change layer 3-2. The first resistance change layer 3-1 prevents the diffusion of the filament to the lower electrode 2. In other words, the first resistance change layer 3-1 is formed between the second resistance change layer 3-2 and lower electrode 2 in order to form a space between the filament of the second resistance change layer 3-2 and the lower electrode 2.

In this embodiment, an arrangement in which an n-type Si layer is used as the lower electrode 2, two kinds of amorphous silicon films formed under different deposition conditions are used as the resistance change layer 3, and Ag is used as the upper electrode 1 will be taken as an example.

[2] Method of Manufacturing Nonvolatile Resistance Change Element

Next, a method of manufacturing the nonvolatile resistance change element disclosed in this embodiment will be explained.

First, phosphorus (P) ions are implanted into a semiconductor substrate, e.g., a silicon single-crystal substrate at an acceleration voltage of 30 keV and a dose of $4\times10^{13}$ cm$^{-2}$. After that, activation annealing is performed on the silicon substrate, thereby forming an n-type silicon layer as the lower electrode 2.

Then, a first amorphous silicon layer as the first resistance change layer 3-1 and a second amorphous silicon layer as the second resistance change layer 3-2 are deposited on the lower electrode 2. That is, the first amorphous silicon layer 3-1 is deposited on the lower electrode 2 at a deposition temperature of 400° C. by using LP-CVD (Low Pressure Chemical Vapor Deposition). Subsequently, the second amorphous silicon layer 3-2 is deposited on the first amorphous silicon layer 3-1 at a deposition temperature of 250° C. by using PE-CVD.

The first amorphous silicon layer 3-1 contains the same element as that of the second amorphous silicon layer 3-2, but differs from the second amorphous silicon layer 3-2 in density, number of dangling bonds, or number of defects. Even when using the same amorphous silicon, if the film quality changes in accordance with the deposition conditions, the switching conditions change in the resistance change element 30. For example, the first amorphous silicon layer 3-1 preferably has a higher density, a larger number of dangling bonds, and a larger number of defects than those of the second amorphous silicon layer 3-2.

[3] Characteristics of Nonvolatile Resistance Change Element

Figures 12A, 12B:
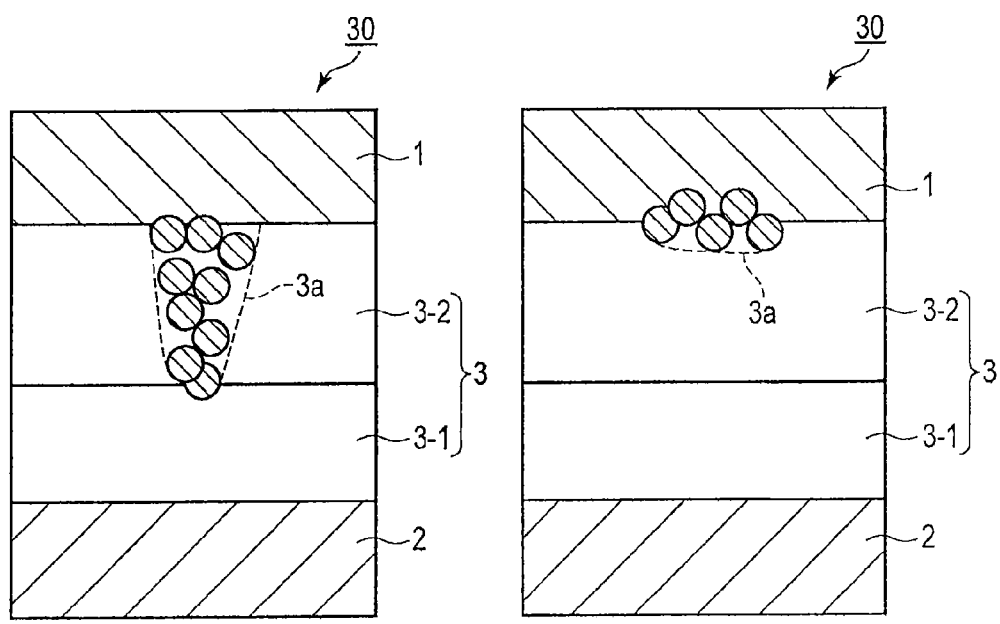
FIGS. 12A and 12B are sectional views respectively showing the low-resistance state and high-resistance state of the nonvolatile resistance change element according to the third embodiment.

FIG. 12A is a sectional view showing the low-resistance state of the nonvolatile resistance change element 30 shown in FIG. 11. FIG. 12B shows the high-resistance state of the nonvolatile resistance change element 30, in which the filament has disappeared.

As shown in FIG. 12A, when a filament 3a grows, the first amorphous silicon layer 3-1 functions as an anti-diffusion layer against the filament 3a. Consequently, a space can be formed between the filament 3a and lower electrode 2. This makes it possible to obtain the same effect as that of the second embodiment.

Fourth Embodiment

In the fourth embodiment, a memory cell array to which the nonvolatile resistance change element of the embodiment is applied will be explained.

Figure 13A:
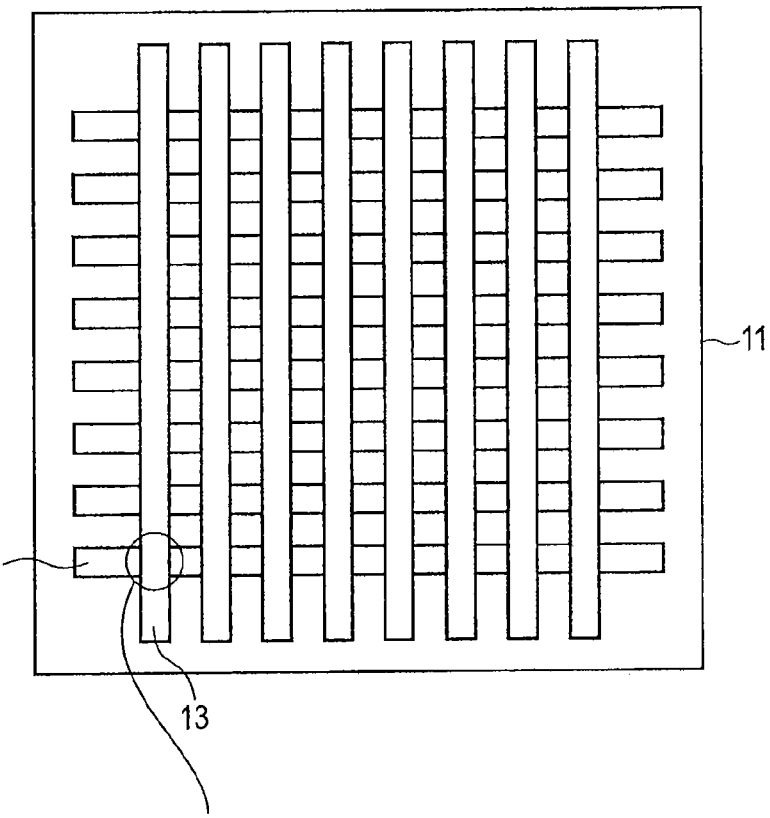
FIGS. 13A, 13B, 13C, 13D, 13E, 13F, 13G, and 13H are views showing the arrangements of a memory cell array according to a fourth embodiment.
Figure 13B:
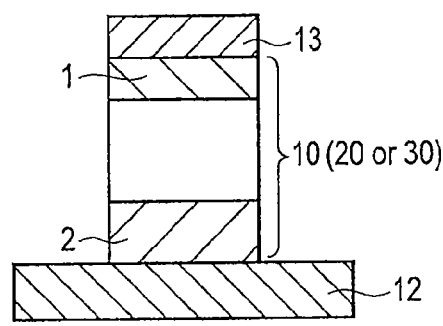
Figure 13C:
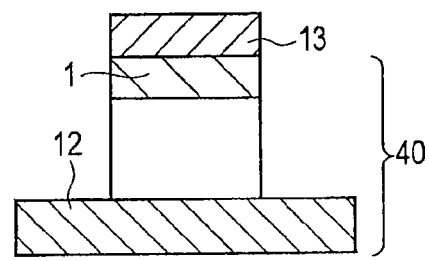
Figure 13D:
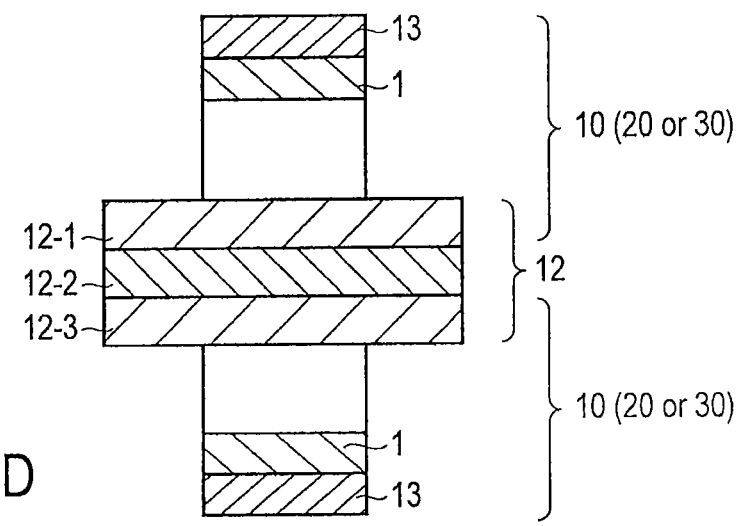

FIG. 13A is a plan view showing the arrangement of the memory cell array according to the fourth embodiment. FIGS. 13B, 13C, and 13D are sectional views each showing the structure of a cross-point portion of the memory cell array shown in FIG. 13A. FIGS. 13E, 13F, 13G, and 13H are sectional views each showing the structure of cross-point portions in the memory cell array.

As shown in FIG. 13A, a memory cell array 11 includes lower interconnections 12, and upper interconnections 13 intersecting the lower interconnections 12. Nonvolatile resistance change elements 10 (20 or 30) disclosed in the first, second, or third embodiment are arranged in cross-point portions of the lower interconnections 12 and upper interconnections 13. That is, as shown in FIG. 13B, the nonvolatile resistance change element 10 (20 or 30) is formed between the lower interconnection 12 and upper interconnection 13.

FIG. 13C is a sectional view showing another structure of the cross-point portion shown in FIG. 13A. The cross-point portion may also have the structure as shown in FIG. 13C. A resistance change layer 3 (or an anti-diffusion layer 4 and the resistance change layer 3) is formed on the lower interconnection 12, and an upper electrode 1 is formed on the resistance change layer 3. In addition, the upper interconnection 13 is formed on the upper electrode 1. In this structure, the lower interconnection 12 contains an n-type semiconductor layer, and the lower interconnection 12, the resistance change layer 3 (or the anti-diffusion layer 4 and resistance change layer 3), and the upper electrode 1 form a nonvolatile resistance change element 40. The nonvolatile resistance change element 40 has the same characteristics as those of the nonvolatile resistance change elements described in the first to third embodiments.

Note that when using an n-type semiconductor layer as the lower interconnection 12, the thickness of the n-type semiconductor layer must be made much larger than that of a depletion layer to be formed in the n-type semiconductor layer, thereby maintaining the conductivity of the lower interconnection 12. For example, the thickness of the lower interconnection 12 is preferably 50 nm or more.

FIG. 13D is a sectional view showing still another structure of the cross-point portion shown in FIG. 13A. The cross-point portion may also have the structure as shown in FIG. 13D.

As shown in FIG. 13D, it is also possible to give a multilayered structure to the lower interconnection 12, and form the nonvolatile resistance change elements 10 (20 or 30) above and below the lower interconnection 12. More specifically, it is possible to give a three-layered structure including an upper layer 12-1, interlayer 12-2, and lower layer 12-3 to the lower interconnection 12 in contact with the resistance change layer 3 (or the anti-diffusion layer 4), use n-type semiconductor layers as the upper layer 12-1 and lower layer 12-3, and use a metal layer as the interlayer 12-2. In this structure, the resistivities of the n-type semiconductor layer and metal layer are different by a few orders of magnitude, so the most of the electric current flows through the metal layer. Accordingly, an electric current can be supplied even when the n-type semiconductor layers are completely depleted.

Figure 13E:
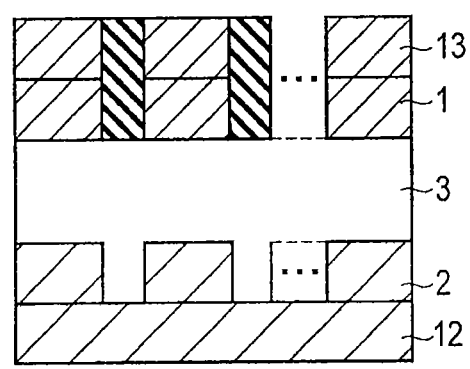
Figure 13F:
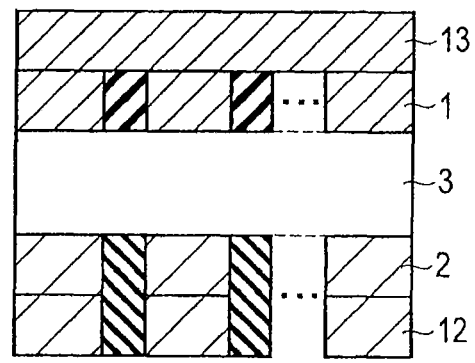

Also, in FIG. 13B, when the upper interconnection 13 and lower interconnection 12 intersect and a lower electrode (n-type semiconductor) 2 and the upper electrode 1 are formed in the cross-point portion of the upper interconnection 13 and lower interconnection 12, the resistance change layer (or the anti-diffusion layer and resistance change layer) may also be a flat film formed on the entire surface. However, the film thickness of the resistance change layer (or the anti-diffusion layer and resistance change layer) is desirably smaller than the distance between the upper interconnections 13 and the distance between the lower interconnections 12. FIGS. 13E and 13F are sectional views in which a plurality of nonvolatile resistance change elements 10 shown in FIG. 13B are arranged. FIG. 13E shows a section taken along the lower interconnection 12, and FIG. 13F shows a sectional taken along the upper interconnection 13. As shown in FIGS. 13E and 13F, the resistance change layer 3 (or the anti-diffusion layer 4 and resistance change layer 3) is a flat film formed on the entire surface over the plurality of nonvolatile resistance change elements.

Figure 13G:
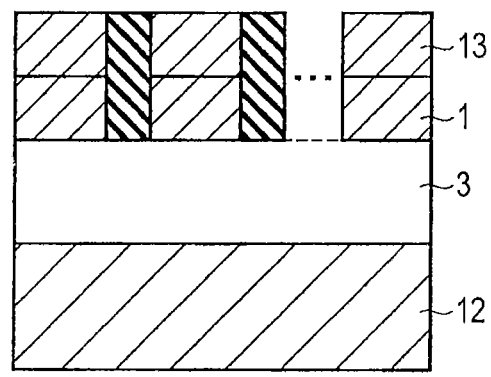
Figure 13H:
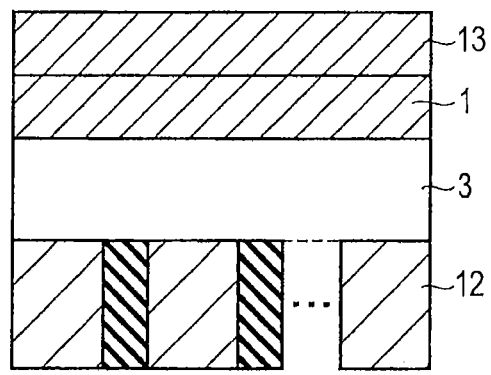

Furthermore, in FIG. 13C, when the upper interconnection 13 and lower interconnection (n-type semiconductor) 12 intersect and the upper electrode 1 is formed in the cross-point portion of the upper interconnection 13 and lower interconnection 12, the resistance change layer (or the anti-diffusion layer and resistance change layer) may also be a flat film formed on the entire surface. However, the film thickness of the resistance change layer (or the anti-diffusion layer and resistance change layer) is desirably smaller than the distance between the upper interconnections 13 and the distance between the lower interconnections 12. FIGS. 13G and 13H are sectional views in which a plurality of nonvolatile resistance change elements 10 shown in FIG. 13C are arranged. FIG. 13G shows a section taken along the lower interconnection 12, and FIG. 13H shows a sectional taken along the upper interconnection 13. As shown in FIGS. 13G and 13H, the resistance change layer 3 (or the anti-diffusion layer 4 and resistance change layer 3) is a flat film formed on the entire surface over the plurality of nonvolatile resistance change elements.

Figure 14:
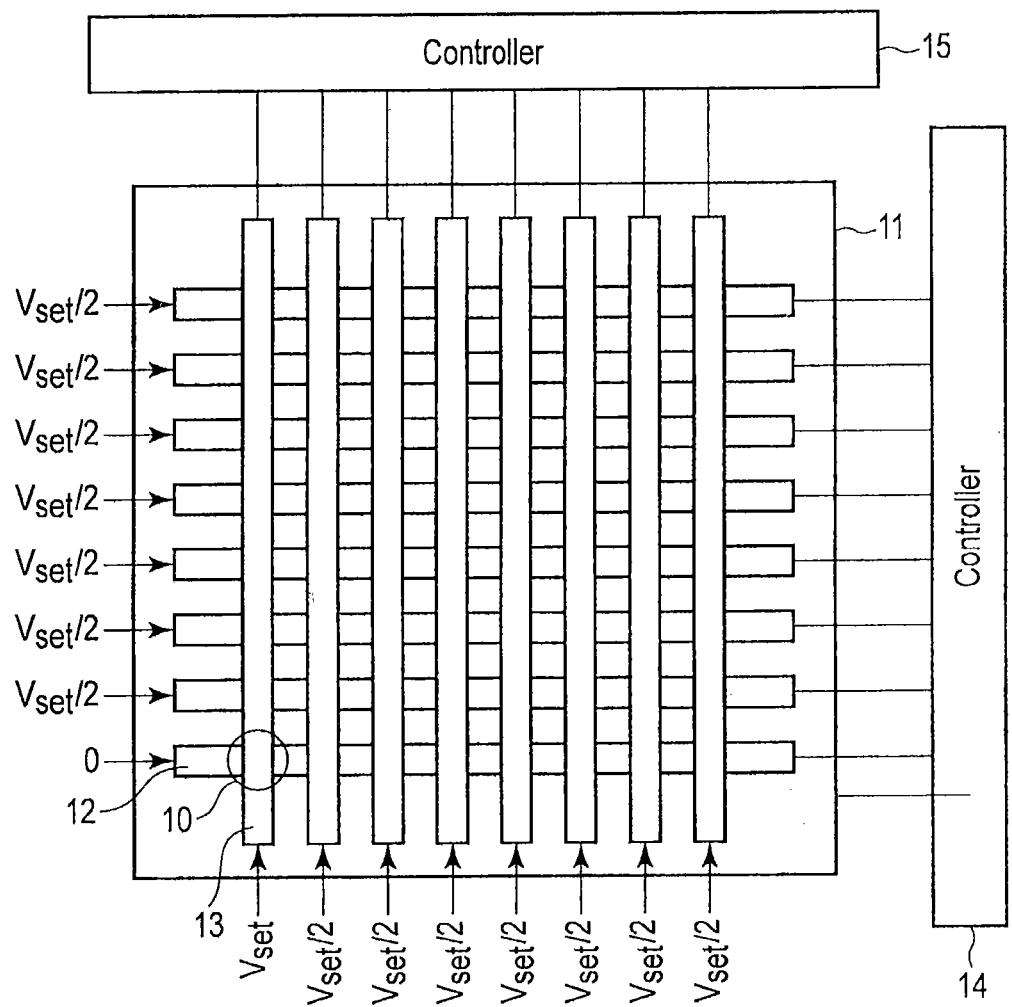
FIG. 14 is a plan view showing a voltage setting method when writing data in a selected cell in the memory cell array according to the fourth embodiment.

FIG. 14 is a plan view showing a voltage setting method when writing data in a selected cell in the memory cell array shown in FIG. 13A.

As shown in FIG. 14, controllers 14 and 15 for applying potentials to the lower interconnections 12 and upper interconnections 13 are formed in the periphery of the memory cell array 11. When writing data in a selected cell 10, a set voltage Vset is applied to the upper interconnection 13 connected to the selected cell 10, and a ½ voltage of the set voltage Vset is applied to other upper interconnections. On the other hand, 0 V is applied to the lower interconnection 12 connected to the selected cell 10, and the ½ voltage of the set voltage Vset is applied to other lower interconnections 12.

Consequently, the set voltage Vset is applied to the selected cell 10, and the data is written in it. On the other hand, the ½ voltage of the set voltage Vset is applied to semi-selected cells designated by unselected lines and selected lines of the upper interconnections 13 and lower interconnections 12, thereby inhibiting data write. Also, 0 V is applied to unselected cells designated by the unselected lines of the upper interconnections 13 and lower interconnections 12, thereby inhibiting data write.

Figure 15:
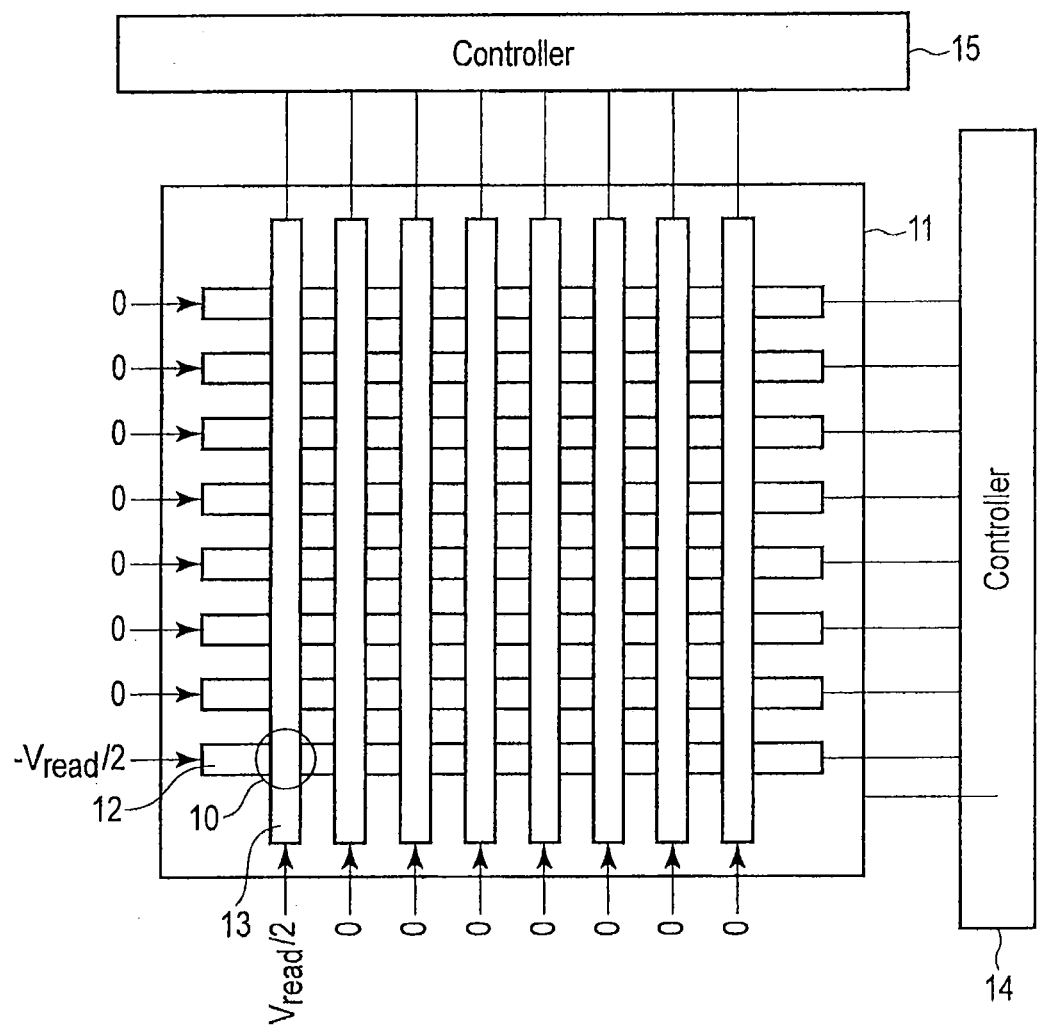
FIG. 15 is a plan view showing a voltage setting method when reading data from a selected cell in the memory cell array according to the fourth embodiment.

FIG. 15 is a plan view showing a voltage setting method when reading out data from a selected cell in the memory cell array shown in FIG. 13A.

When reading out data from the selected cell 10 as shown in FIG. 15, a ½ voltage of a read voltage Vread is applied to the upper interconnection 13 connected to the selected cell 10, and 0 V is applied to other upper interconnections. Also, a "−½" voltage of the read voltage Vread is applied to the lower interconnection 12 connected to the selected cell 10, and 0 V is applied to other lower interconnections.

Consequently, the read voltage Vread is applied to the selected cell 10, and the data is read from it. On the other hand, the ½ voltage of the read voltage Vread is applied to semi-selected cells designated by unselected lines and selected lines of the upper interconnections 13 and lower interconnections 12, thereby inhibiting data read. Furthermore, 0 V is applied to unselected cells designated by the unselected lines of the upper interconnections 13 and lower interconnections 12, thereby inhibiting data read.

Figure 16:
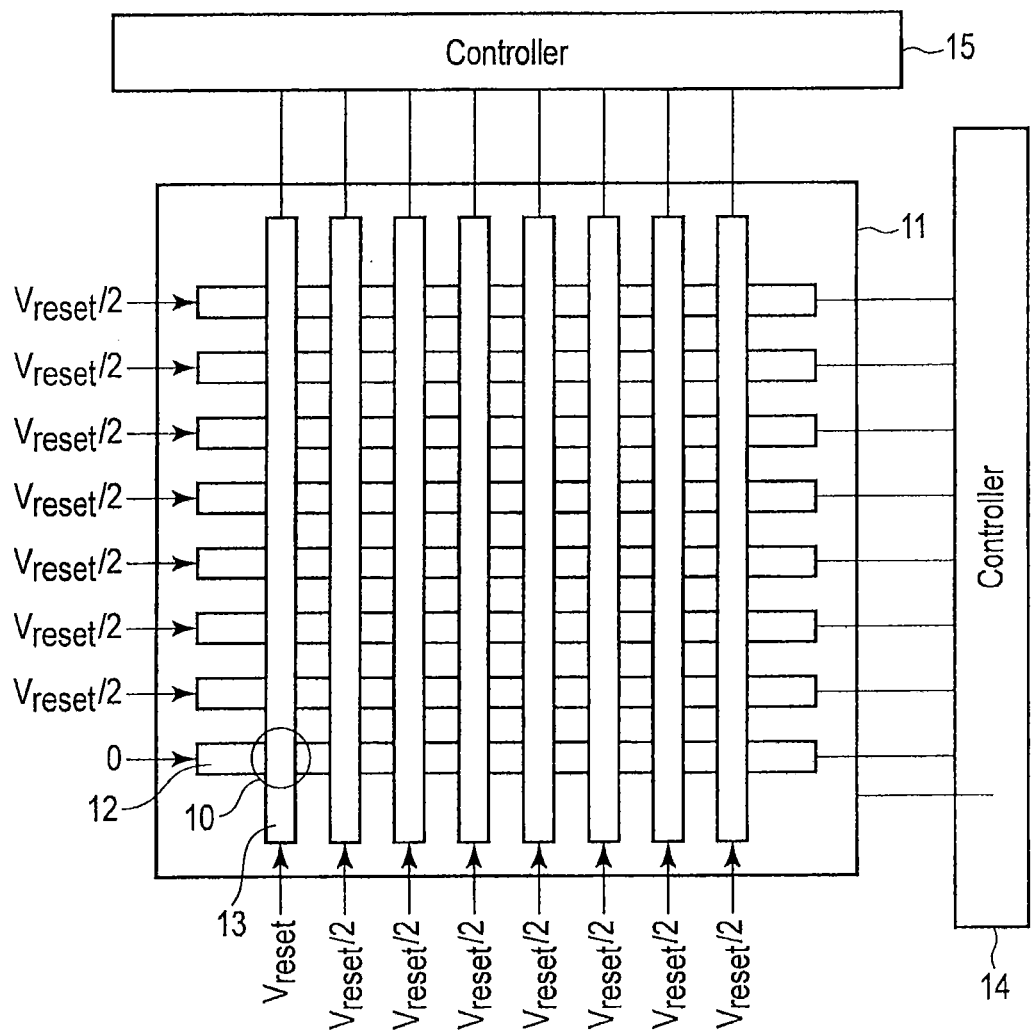
FIG. 16 is a plan view showing a voltage setting method when erasing data from a selected cell in the memory cell array according to the fourth embodiment.

FIG. 16 is a plan view showing a voltage setting method when erasing data from a selected cell in the memory cell array shown in FIG. 13A.

When erasing data from the selected cell 10 as shown in FIG. 16, a reset voltage Vreset is applied to the upper interconnection 13 connected to the selected cell 10, and a ½ voltage of reset voltage Vreset is applied to other upper interconnections. Also, 0 V is applied to the lower interconnection 12 connected to the selected cell 10, and the ½ voltage of the reset voltage Vreset is applied to other lower interconnections.

Consequently, the reset voltage Vreset is applied to the selected cell 10, and the data is erased from it. On the other hand, the ½ voltage of the reset voltage Vreset is applied to half-selected cells designated by unselected lines and selected lines of the upper interconnections 13 and lower interconnections 12, thereby inhibiting data erase. Furthermore, 0 V is applied to unselected cells designated by the unselected lines of the upper interconnections 13 and lower interconnections 12, thereby inhibiting data erase.

When performing write, read, and erase to the selected cell 10, a potential difference between selected lines and unselected lines of the upper interconnections 13 and lower interconnections 12 generates a sneak current via semi-selected cells and unselected cells. However, as described in the first to third embodiments, the nonvolatile resistance change element of this embodiment has a rectifying function and can prevent this sneak current.

Also, this embodiment is directed to the techniques of a single memory cell and independent of a memory cell connecting method, so this embodiment is applicable to any circuit.

As has been explained above, the embodiment can provide a nonvolatile resistance change element capable of reducing the deterioration and variation of the device characteristics and having a rectifying function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile resistance change element comprising:
    a first electrode comprising a metal element;
    a second electrode comprising an n type semiconductor;
    a first layer provided between the first electrode and the second electrode, the first layer including a conductor portion made of the metal element, and the conductor portion and the second electrode being spaced apart; and
    a second layer provided between the first layer and the second electrode, and which is in contact with the first layer and the second electrode,
    wherein the first layer and the second layer are made of silicon oxide, or the first layer and the second layer are made of silicon nitride, or the first layer and the second layer are made of silicon oxynitride, and
    wherein the second layer differs from the first layer in one of a density, a number of dangling bonds, or a number of defects.

2. The element according to claim 1, wherein a diffusion coefficient for the metal element in the second layer is smaller than that of the first layer.

3. The element according to claim 1, wherein an impurity concentration of the n-type semiconductor comprised in the second electrode is not more than $1 \times 10^{18}$ cm$^{-3}$.

4. The element according to claim 1, wherein the metal element comprised in the first electrode includes at least one of Ag, Co, Ni, Ti, Cu, and Al.

5. The element according to claim 1, further comprising:
an interconnection layer formed on a surface of the second electrode, which is opposite to a surface on which the first layer is formed; and
a third electrode formed on a surface of the interconnection layer, which is opposite to the surface on which the second electrode is formed, and comprising an n-type semiconductor.

6. A nonvolatile resistance change element comprising:
a first electrode comprising a metal element;
a second electrode comprising an n-type semiconductor;
a first layer provided between the first electrode and the second electrode; and
a second layer provided between the first layer and the second electrode,
wherein the first layer and the second layer are made of silicon oxide, or the first layer and the second layer are made of silicon nitride, or the first layer and the second layer are made of silicon oxynitride, and
wherein the second layer differs from the first layer in one of a density, a number of dangling bonds, or a number of defects,
wherein a reset operation of changing a low-resistance state to a high-resistance state is performed by a reset voltage to be applied between the first electrode and the second electrode, and
when a voltage is swept from 0 V to the reset voltage between the first electrode and the second electrode, a maximum value of a current change amount between a $\frac{1}{10}$ voltage of the reset voltage and the reset voltage is not more than an order of magnitude.

7. The element according to claim 6,
wherein the first layer includes a conductor portion made of the metal element, and the second layer suppresses invasion of the conductor portion.

8. The element according to claim 7, wherein a diffusion coefficient for the metal element in the second layer is smaller than that of the first layer.

9. The element according to claim 6, wherein an impurity concentration of the n-type semiconductor comprised in the second electrode is not more than $1 \times 10^{18}$ cm$^{-3}$.

10. The element according to claim 6, wherein the metal element comprised in the first electrode includes at least one of Ag, Co, Ni, Ti, Cu, and Al.

11. The element according to claim 6, further comprising:
an interconnection layer formed on a surface of the second electrode, which is opposite to a surface on which the first layer is formed; and
a third electrode formed on a surface of the interconnection layer, which is opposite to the surface on which the second electrode is formed.

12. A nonvolatile resistance change element comprising:
a first electrode comprising a metal element;
a second electrode comprising an n-type semiconductor layer; and
a first layer provided between the first electrode and the second electrode; and
a second layer provided between the first layer and the second electrode,
wherein the first layer and the second layer are made of silicon oxide, or the first layer and the second layer are made of silicon nitride, or the first layer and the second layer are made of silicon oxynitride, and
wherein the second layer differs from the first layer in one of a density, a number of dangling bonds, or a number of defects,
wherein a reset operation of changing a low-resistance state to a high-resistance state is performed by a reset voltage to be applied between the first electrode and the second electrode, and
when a voltage is swept from 0 V to the reset voltage between the first electrode and the second electrode, a maximum value of a current change amount between 0 V and a $\frac{1}{2}$ voltage of the reset voltage is smaller than that of a current change amount between the $\frac{1}{2}$ voltage of the reset voltage and the reset voltage.

13. The element according to claim 12,
wherein the first layer includes a conductor portion made of the metal element, and the second layer suppresses invasion of the conductor portion.

14. The element according to claim 13, wherein a diffusion coefficient for the metal element in the second layer is smaller than that of the first layer.

15. The element according to claim 12, wherein an impurity concentration of the n-type semiconductor comprised in the second electrode is not more than $1 \times 10^{18}$ cm$^{-3}$.

16. The element according to claim 12, wherein the metal element comprised in the first electrode includes at least one of Ag, Co, Ni, Ti, Cu, and Al.

17. The element according to claim 12, further comprising:
an interconnection layer formed on a surface of the second electrode, which is opposite to a surface on which the first layer is formed; and
a third electrode formed on a surface of the interconnection layer, which is opposite to the surface on which the second electrode is formed.

* * * * *